United States Patent [19]
Watanabe

[11] Patent Number: 4,760,575
[45] Date of Patent: Jul. 26, 1988

[54] IC CARD HAVING FAULT CHECKING FUNCTION

[75] Inventor: Hiroshi Watanabe, Kokubunji, Japan

[73] Assignee: Toppan Moore Company, Ltd, Tokyo, Japan

[21] Appl. No.: 870,110

[22] Filed: Jun. 3, 1986

[30] Foreign Application Priority Data

Jun. 4, 1985 [JP] Japan .................. 60-121082

[51] Int. Cl.[4] .......................................... G01R 31/28
[52] U.S. Cl. ........................................ 371/21; 371/25
[58] Field of Search .................... 371/21, 24, 25; 324/73 R, 73 AT

[56] References Cited

U.S. PATENT DOCUMENTS

| | | | |
|---|---|---|---|
| 3,579,199 | 5/1971 | Anderson et al. | 371/21 X |
| 4,319,355 | 3/1982 | Mollier | 371/21 |
| 4,414,665 | 11/1983 | Kimura et al. | 371/21 |
| 4,559,626 | 12/1985 | Brown | 371/21 |
| 4,584,663 | 4/1986 | Tanikawa | 364/900 |

Primary Examiner—Charles E. Atkinson
Attorney, Agent, or Firm—Kenyon & Kenyon

[57] ABSTRACT

Disclosed is an IC card having a fault check function comprising a ROM having test areas of the number corresponding to memory address lines so that predetermined various data necessary for executing a fault check are recorded in advance into the test areas, means for successively reading out the data previously recorded in the test areas, means for detecting coincidence of the respective data successively read out by the reading-out means with corresponding ones of said predetermined data previously recorded n the test areas, and means for making judgement as to whether a fault exists or not on the basis of a result of detection by the coincidence detecting means.

4 Claims, 7 Drawing Sheets

IC CARD HAVING FAULT CHECKING FUNCTION

BACKGROUND OF THE INVENTION

1. Field of the Invention

The present invention generally relates to IC cards and particularly relates to IC cards having a fault checking function.

2. Description of the Prior Art

Generally, an IC card has a structure as shown in FIG. 1. That is, an IC card 1 has a card core 2 made of, for example, a plastic material and formed with a recess 3 in which an IC module 4 is accommodated. One or two LSI chips are mounted on the IC module 4. The IC module 4 is provided with eight contact terminals 5 through which an electric circuit including the IC module 4 and an external circuit are electrically connected with each other.

The recess 3 is filled with a filler 6 to protect the IC module 4. Printing layers 7 and 7' are bonded on the opposite surfaces of the card core 2. Designs, characters, marks, or the like, are printed on the printing layers 7 and 7' if necessary, and the surfaces of the printing layers 7 and 7' are coated with surface layers 8 and 8' for protecting the printing layers 7 and 7' respectively. Although FIG. 1 is illustrated with exaggeration particularly in thickness, the actual thicknesses of the card core 2, each of the printing layers 7 and 7', and each of the surface layers 8 and 8' are finished to be, for example, 0.55 mm, 0.1 mm, and 0.02 mm, respectively, so that the total thickness of the card is about 0.8 mm.

FIG. 2 is a block diagram showing a structure of an IC included in the IC module 4. The IC includes two chips, that is a CPU chip 40 and a memory chip 41. The CPU chip 40 includes a CPU 401 which perform control in accordance with a program, a ROM 402 which stores the program and so on, and a RAM 403 which temporarily stores data in the midway of a process executing the program. The memory chip 41 has a PROM 411 in which various data are mainly stored. Of various kinds of PROMs, used is an EPROM which is a PROM erasable by ultraviolet rays (when embedded in an IC card, the data stored therein cannot be erased unless a window is formed for allowing ultraviolet rays to pass therethrough), or an EEPROM which is an electrically erasable PROM (that is, data stored therein can be electrically erased).

Since an IC card is made very thin in its thickness, there often occurs a fault in an electric circuit in the IC card, for example, disconnection, shortcircuit, etc., due to mechanical stress, particularly bending, shocks, or the like, and sometimes a fault may be generated in the process of manufacturing the IC card. A fault often generated in an IC card is disconnection caused mainly at four portions shown by four arrows in FIG. 1. Another fault is damage or the like of a memory due to static electricity. If there occurs such a fault, it becomes impossible to carry out data writing/reading operations, or the data writing/reading operations become erroneous. If address lines are partly disconnected, a writing area may be erroneously selected or erroneous data may be read out, and if data lines are partly disconnected, data to be written/read may be changed. Particularly, if disconnection is caused in control lines or in a power supply line, the IC card becomes unable to be used.

In the conventional fault check of an IC card, for example, such a method has been employed in which general data are recorded in a memory in advance and an operator reads the data out of the memory so as to judge whether the data processing can be correctly performed or not on the basis of the read-out data.

In such a method, however, there are problems as follows. Upon occurrence of such a fault that any one of data or address lines is disconnected or touches another line, it may happen that the fault does not influence an address or data to be used for the fault check. In such a case, it may be concluded that the IC card is normal in spite of existence of a fault, thereby lowering reliability of the fault check.

Generally, an IC card is vulnerable to mechanical shocks, bending, and static electricity. An IC card is usually carried by a user and effected by various external conditions. Not only mechanical shocks may break an IC card, but an atmospheric discharge of static electricity may damage an IC memory per se, and particularly, there may occur a fault due to a discharge caused when clothes of chemical fibers of the IC card possessor touch a metal piece. On the other hand, IC cards are often used for the management of incoming/outgoing of money, for the management of health, etc., and therefore correctness is required particularly for the data writing/reading operations and erroneous operations should be prevented.

SUMMARY OF THE INVENTION

It is therefore an object of the present invention to solve the above-mentioned problems in the prior art.

It is another object of the present invention to provide an IC card having a fault check function in which a fault check can be carried out easily and correctly at any time prior to data writing/reading operations when the IC card is used by a possessor or a manager of the IC card, and in which a fault check can be carried out also at the time of maintenance such as a product check in manufacturing, inspection after forwarding, etc.

In order to attain the above objects, the IC card having a fault check function according to the present invention comprises a ROM having test areas of the number corresponding to memory address lines so that various predetermined data necessary for executing a fault check are recorded in advance into the test areas, means for successively reading out the data previously recorded in the test areas, means for detecting coincidence of the respective data successively read out by the reading-out means with corresponding ones of said predetermined data previously recorded in the test areas, and means for making judgement as to whether a fault exists or not on the basis of a result of detection by the coincidence detecting means.

According to an embodiment of the present invention, the number of the test areas is selected to be equal to the larger one of the respective numbers of the address lines and the data lines. For example, in the case where the number of the address lines is larger than that of the data lines, there are provided test areas the number of which is equal to or larger than the number of the address lines and it is necessary to provide addresses of the number equal to the number of the test areas. Accordingly, for example, if there are provided addresses which are equal in number to the number of the address lines and which are made different from each other by setting the address lines such that when a selected one of them is in a level "1" the other are in a level "0", it is possible to carry out a fault check for every address line by making access to the respective address by using corresponding one of the thus prepared addresses. In this case, since the number of the data lines is smaller than that of the test areas and the respective data recorded in the test areas are different from each other, in order to make it possible to carry out a fault check for every data line, it will do to form the data so as to include various data which are equal in number to the number of the data lines and each of which are set such that when each data are read out the data lines, a selected one of the data lines is in a level "1" while the other are in a level "0".

In this case, the fault check is carried out in such a manner that the addresses are successively applied onto the address lines in accordance with a fault check program stored in a ROM so as to successively read out the respective data recorded in the test areas, and judgement is successively made as to whether the thus successively read-out data are coincident with the corresponding data recorded in a calculating table. If at least one disagreement is found, it is possible to determine that one of the address lines or one of data lines is faulty.

Particularly, at the time of products check in a manufacturing factory, it is possible to determine on which one of the address and data lines a fault occurs to as to make it possible to easily detect a defect in manufacturing to thereby improve yield in manufacturing process.

According to the fault check of the present invention, it is possible to carry out not only a check for faults caused in address lines and data lines in an IC card, but a check for other faults caused in control lines, power supply lines, and the like (for example lines from the terminals Vcc, CLOCK, RESET, I/O, GND, Vpp to the CPU tip CPU chip 40, the memory chip 41) which other faults also disable the IC card to be driven. Thus, according to the present invention, it is possible to carry out a whole check for an IC card.

In an IC card according to the present invention, it is possible to carry out a fault check not only at the time of forwarding, but prior to the use of the IC card every time the IC card is used so as to enable a command such as data writing/reading given by a possessor of the IC card to be executed only after the IC card has been determined to be in a normal state as a result of the fault check. Accordingly, the reliability of data in the IC cards according to the present invention is extremely high in comparison with the conventional IC cards.

The above and other objects and features of the invention will appear more fully hereinafter from a consideration of the following description taken in connection with the accompanying drawings.

DESCRIPTION OF THE PREFERRED EMBODIMENTS

Figure 1:
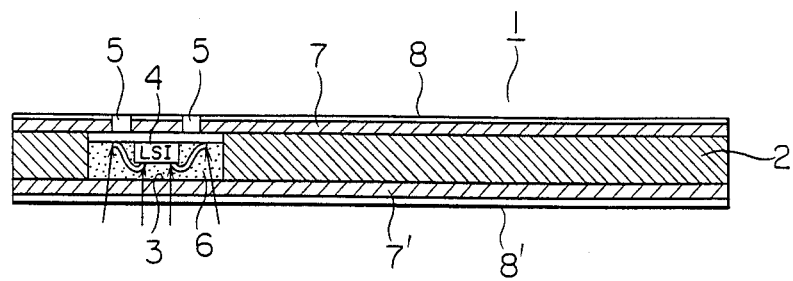
FIG. 1 is a cross-section of a general IC card.

Referring to the drawings, embodiments of the present invention will be described in detail hereunder.

Figure 2:
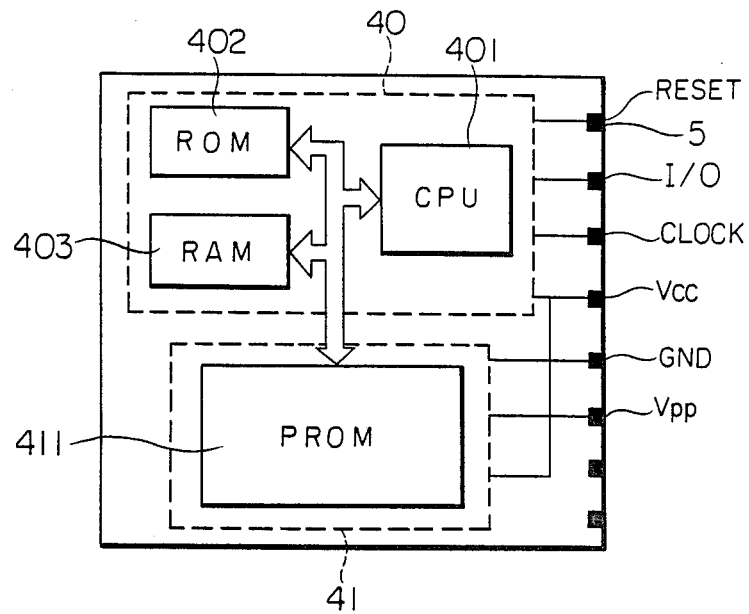
FIG. 2 is a block diagram showing a circuit arrangement of a general IC card.
Figure 3:
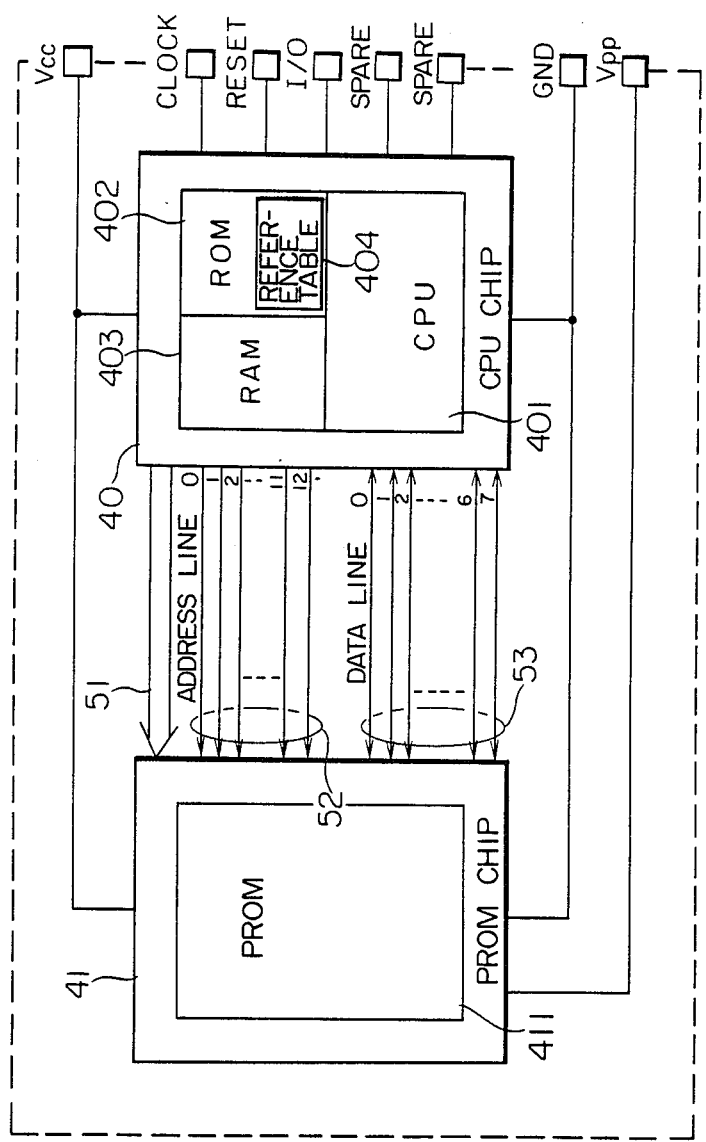
FIG. 3 is a block diagram showing a circuit arrangement of an embodiment of the IC card according to the present invention.

FIG. 3 is a block diagram showing the whole circuit arrangement of an embodiment of the IC card according to the present invention. In FIG. 3, the like or same parts as those in FIG. 2 are referenced correspondingly.

In FIG. 3, a CPU chip 40 and a PROM chip 41 are connected with each other through thirteen address lines 52 of from 0th bit to 12th bit and eight data lines 53 of from 0th bit to 7th bit. The ROM 402 of the CPU chip 40 is provided with a reference table 404 in which data the same as test data recorded in a test area of the PROM chip 41 are stored. According to the present invention, data read out in fault checking are compared with corresponding data read out of the reference table 404 to detect existence of coincidence therebetween. The PROM chip 41 may be substituted by a RAM supported by a built-in battery or the like and it is not necessary to specifically limit the kind of the IC memory.

Figure 4:
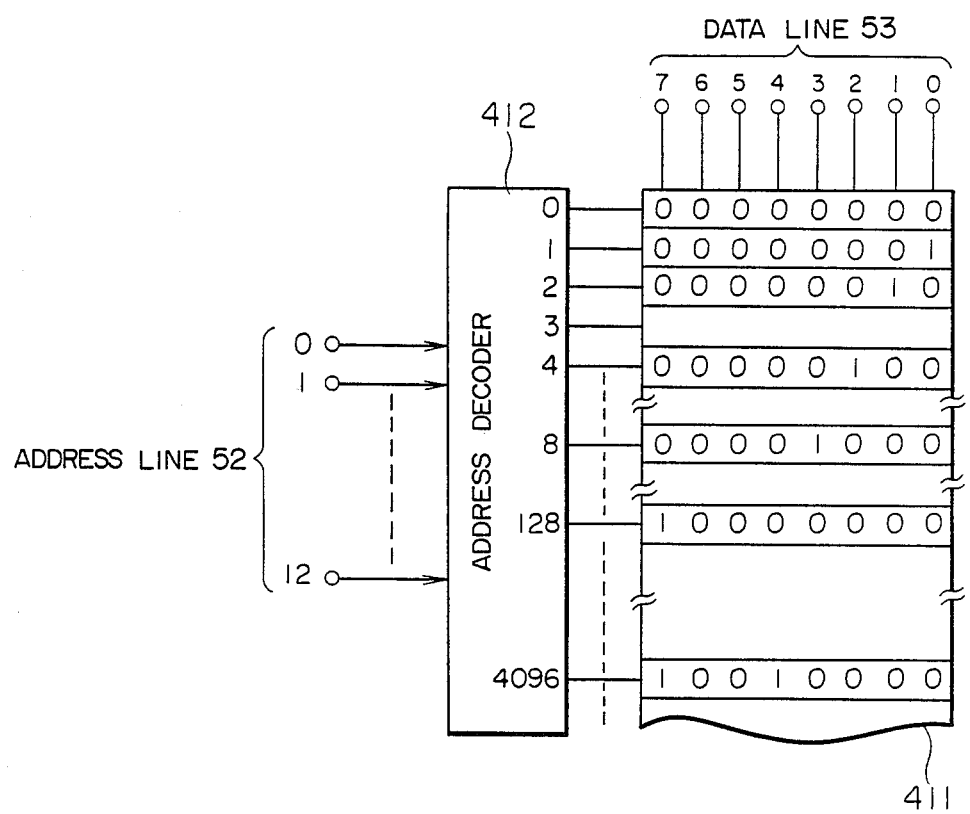
FIG. 4 is an explanatory diagram showing an embodiment of the test address and test data according to the present invention.

FIG. 4 shows more in detail the structure of a main portion of the PROM chip 41 of FIG. 3. In FIG. 4, in response to an address inputted through address lines 52, an address decoder 412 produces an access signal onto one of output lines thereof to make access to a memory area on a PROM 411 corresponding to the address. According to a preferred embodiment of the present invention, for example, among memory areas located at addresses each constituted by thirteen bits, those memory areas located at the addresses in each of which only one specific bit is "1" and the other twelve bits are "0" selected to be the test areas. Accordingly, the addresses of the test areas are 1, 2, 4, 8, 16, 32, 64, 128, 256, 512, 1024, 2048 and 4096. In this embodiment, the memory area located at the address in which all the thirteen bits are "0" is added to the test area. An address of a test areas is referred to as "a test address" and data in a test area is referred to as "test data", hereinafter. Upon application of a test address, test data is read out of a test area corresponding to the test address onto the data line 53.

The test data recorded in the test areas corresponding to the test addresses are as shown in the following Table:

TABLE

| Test Address | Address Line | Test Data |
| --- | --- | --- |
| 0 | 0000000000000 | 00000000 |
| 1 | 0000000000001 | 00000001 |
| 2 | 0000000000010 | 00000010 |
| 4 | 0000000000100 | 00000100 |
| 8 | 0000000001000 | 00001000 |
| 16 | 0000000010000 | 00010000 |
| 32 | 0000000100000 | 00100000 |
| 64 | 0000001000000 | 01000000 |
| 128 | 0000010000000 | 10000000 |
| 256 | 0000100000000 | 10000001 |
| 512 | 0001000000000 | 10000010 |
| 1024 | 0010000000000 | 10000100 |
| 2048 | 0100000000000 | 10001000 |
| 4096 | 1000000000000 | 10010000 |

Such test data as shown above are previously recorded in the respective test areas to which access is made by the corresponding test addresses when the IC card is produced. In the ROM 402, the above Table is stored as the reference table 404 together with a fault checking program for carrying out a fault check by using this reference table 404.

Figure 5:
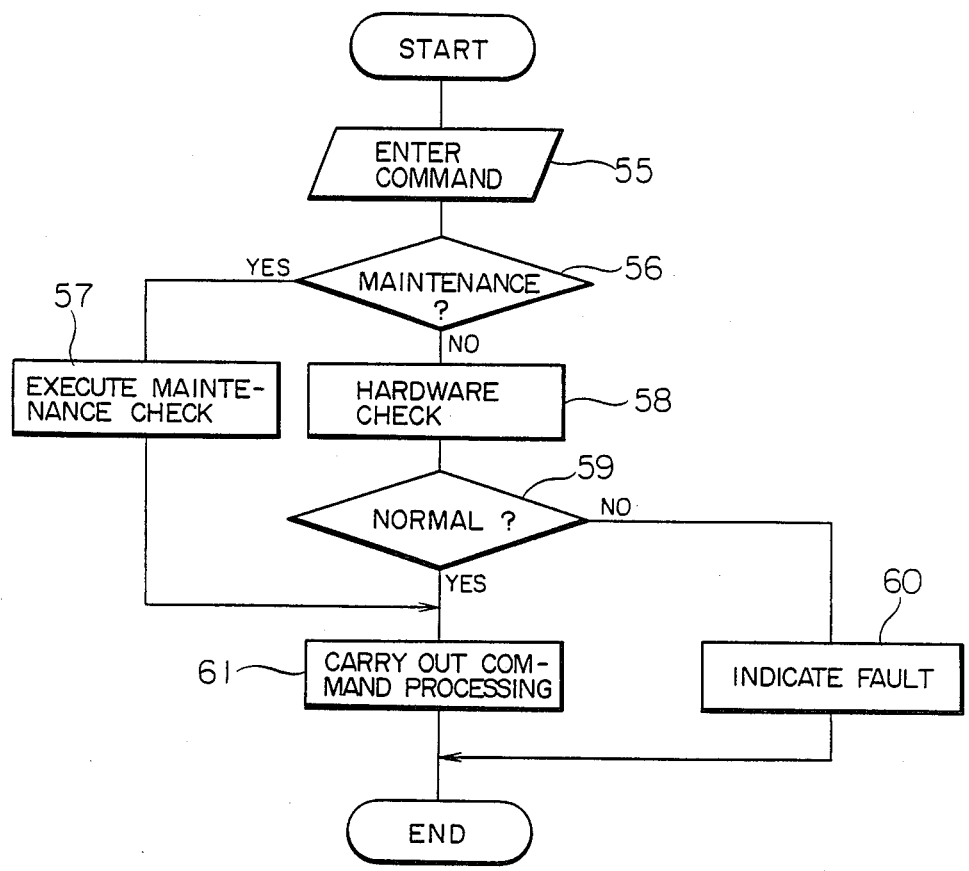
FIG. 5 is a flowchart for explaining an embodiment of the present invention.

The fault check is carried out at the time of writing/reading various pieces of information when the IC card is used by a possessor or a manager of the IC card and at the time of maintenance such as products check in a factory. FIG. 5 shows a procedure of the fault check. In FIG. 5, the fault check operation is started when an IC card is put in a given reader/writer. If a command is entered through any means such as a key board in a step 55, a judgement is made as to whether the command indicators maintenance such as products check in a factory or not at a step 56. If the judgement in the step 56 concludes with "YES", the fault check according to the present invention is carried out in a step 57 according to a predetermined fault check program for maintenance.

If the judgement in the step 56 concludes with "NO", the command entered in the step 55 is determined to be a general command for writing/reading information, and the fault check according to the present invention is carried out in a step 58 according to a fault check program before the command is executed. The result of this fault check is judged in a step 59. When the judgement in the step 59 proves the card is "NORMAL", the processing instructed by the entered command is executed. If the judgement in the step 59 proves the card is "ABNORMAL", the existence of a fault is indicated in a step 60, and the processing instructed by the entered command is not executed. Thus, information can be prevented from being erroneously written into or read out of the IC card when a fault is in the IC card, and existence of a fault in IC card can be detected properly.

Next, description will be made, by way of example, as to a case where a fault has been caused at a part of the address lines or the data lines.

For example, when the address lines 2 (the third address line from the upper one in FIGS. 3 and 4) is disconnected, the third bit of the entered address is not inputted to the address decoder 412. In this case, although the third bit of the entered address is inputted to the address decoder 412 always at the same fixed level, whether the level is "1" or "0" cannot be absolutely said because it depends on the circuit arrangement. Particularly, the level is "0" if the address line 2 is grounded, while "1" the address line 2 is connected to a power supply line. Alternatively, there is a possibility that the address line 2 is connected to the adjacent address line 1 or 3. In this case, the level always becomes the same as the adjacent address line 1 or 3.

First, when the address line 2 is grounded, the third bit of the address is always "0". Accordingly, although correct test data are read out for the test addresses 0, 1, 2, 8, 16, . . . , and 4096, the test data at the address 0 is erroneously read out for the test address 4. Accordingly, if the test data at the address 0 is erroneously read out for any one of the test addresses, it can be determined that the address line corresponding to the bit which gives "1" to that one test address is grounded.

On the other hand, when the address line 2 is connected to the power supply line and the third bit is at a level "1", correct test data can be read out only for the test address 4, while correct test data cannot be read out for any of the other test addresses. For example, for the test address 1 access is made to the address 5 and for the test address 8 access is made to the address 12, so that data at areas other than the correct test areas are read out. Accordingly, if correct data are read out only for any one of the test addresses, it can be determined that the address line corresponding to the bit which gives "1" to that one test address is connected to the power supply line.

Further, when the address line 2 is connected to the adjacent address line 3, erroneous access is made to the address 12 for the test addresses 4 and 8 so that correct test data can not be read out, while correct test data can be read out for any of the test addresses other than 4 and 8. Accordingly, if correct data cannot be read out for only two adjacent test addresses, it can be determined that the address lines corresponding to the bits which give "1" to those two adjacent test addresses respectively are connected to each other.

Now, consideration is made as to the case where a fault occurs at a part of the data lines. For example, it is assumed that a fault is caused at the data line 3. If the data line 3 (the fourth bit from right in FIG. 4) is shorted to the earth, correct data cannot be read out only for the test addresses 8 and 2048 (see the above Table). Alternatively, if the data line 3 is connected to the power supply line, "1" is always produced on the data line 3 so that correct test data can be read out only for the test addresses 8 and 2048 while errors are caused for other test addresses. Further, if the data line is shorted to the data line 4, the same level is always produced on the data lines 3 and 4, so that errors are caused for the test addresses 8, 16, 204, and 4096, while correct data can be read out for the other test addresses. Accordingly, it is possible to detect a faulty data line by detecting the fact on which data line an error is caused for which test address.

As described above, even in the case where a fault exists at a part of the address lines or the data lines, not only it is possible to detect the existence of the fault but it is possible to determine on which one or ones of the lines the fault has been caused. Thus, the invention is useful also for the products check and for the check carried out at the time of maintenance. For the check carried out every time information is written in and read out of an individual IC card, it is sufficient to effect only a check as to existence of a fault.

Figure 6:
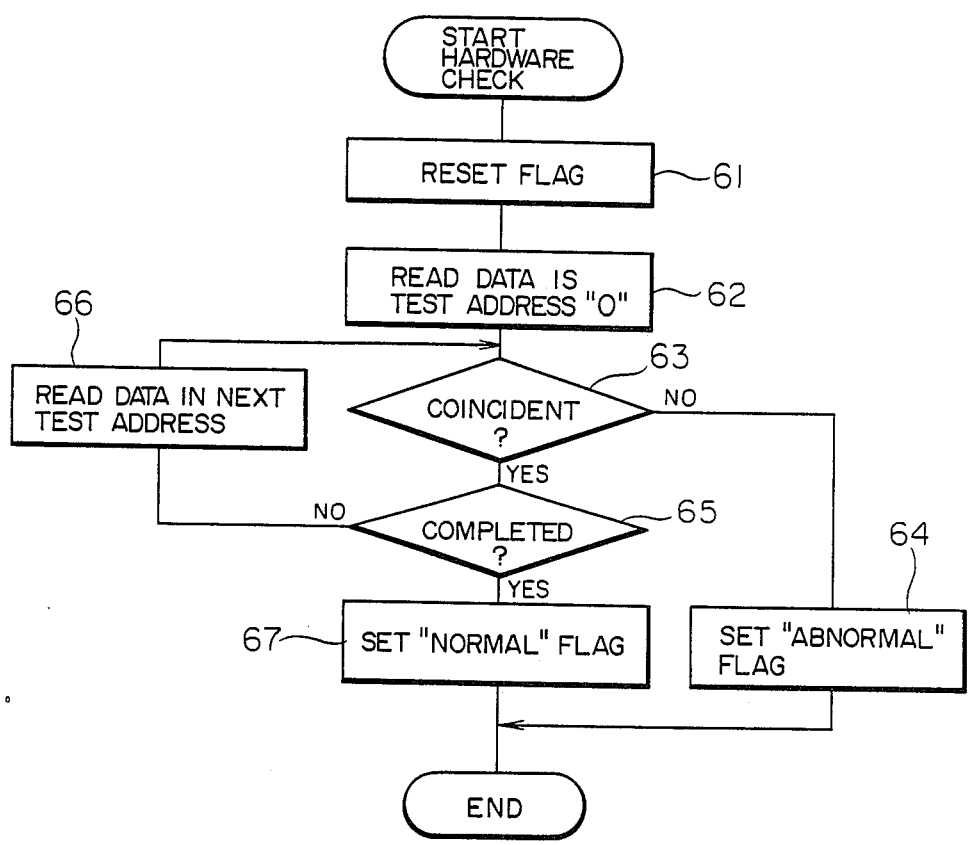
FIGS. 6 and 7 are flowcharts for showing main portions of FIG. 5 more in detail.

Referring now to FIG. 6, the contents of the hardware check in the step 58 of FIG. 5 will be described. In a step 61, a flag indicating normality/abnormality described later is reset to an initial state. Then, data for the first test address 0 are read out in the step 62, and judgement is made as to whether the read out data are coincident with the corresponding test data in the calculating table 404 stored in the ROM 402 in a step 63 or not. If the result of judgement in the step 63 is "NO", a flag bit indicating an abnormality is set in a step 64. If the conclusion in the step 63 is "YES", on the contrary, judgement is made in a step 65 as to whether data reading for all the test addresses has been completed or not. In the result of judgement in the step 65 is "NO", the test data for the next test address is read out in a step 66 and then the operation is returned to the step 63 to repeat the foregoing operations. If the conclusion in the step 65 is "YES", a flag bit indicating a normality is set in a step 67. The judgement in the step 59 in FIG. 5 is made on the basis of the contents of the flag bit set in the step 64 or step 67.

Figure 7:
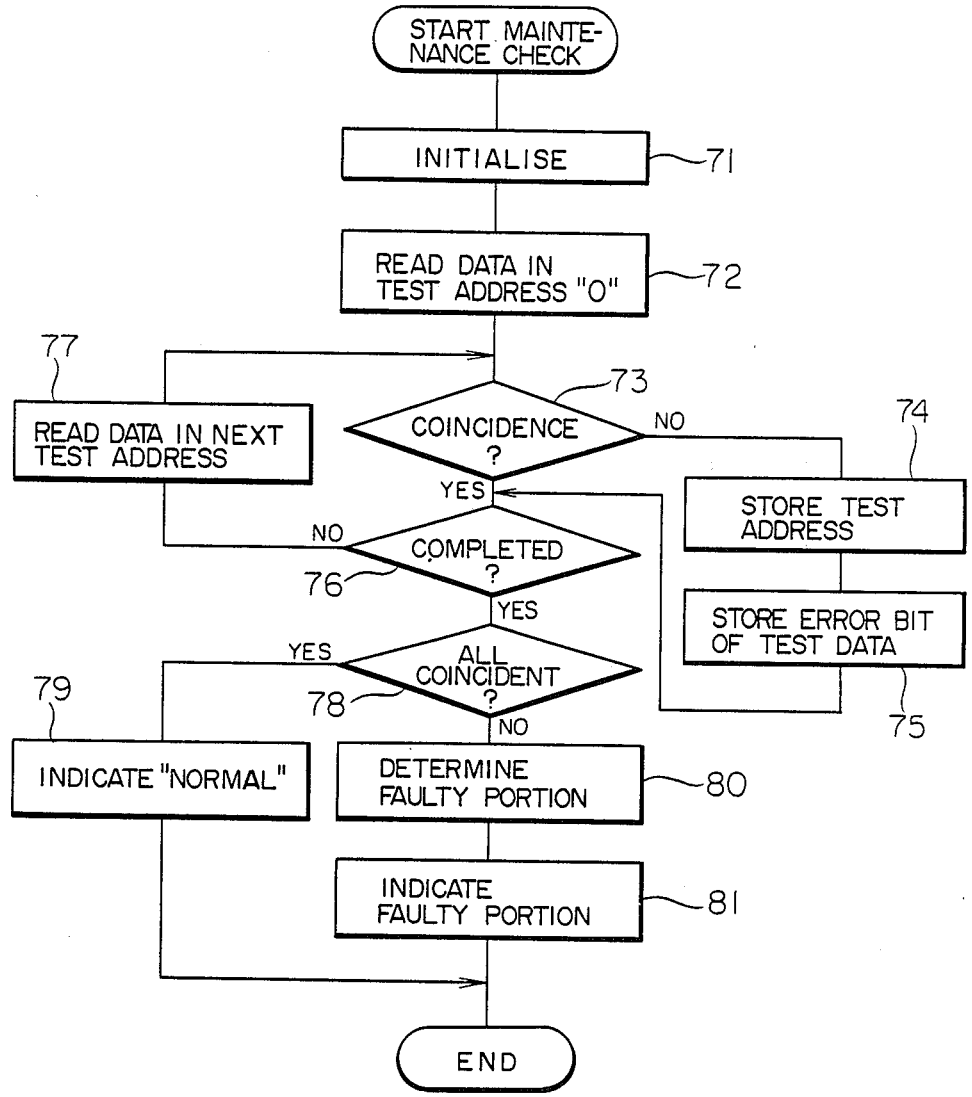

Referring to FIG. 7, description is made as to the contents of the fault check carried out in the step 57 when it is determined that the check is for "maintenance" in the step 56.

In FIG. 7, RAM areas or the like for storing a test address and a faulty bit when a fault is detected are reset to be in an initial state in a step 71, and data for the first test address 0 are read out in a step 72. Then, judgement is made in a step 73 as to whether the read-out data are coincident with the corresponding data in the reference table 404. If the result of judgement in the step 73 is "NO", that test address is stored into the RAM 403 in a step 74, the bit in which the fault of the read-out data exists is stored into the RAM 403 in a step 75, and then the operation is shifted to the next step 76. If the result of judgement in the step 73 is "YES", the operation is shifted also to the step 76. In the step 76, judgement is made as to whether data reading for all the test addresses has been completed or not. If the result of judgement in the step 76 is "NO", data for the next test address are read out in a step 77, and then the operation is returned to the step 73 so as to repeat the foregoing operations. If the result of judgement in the step 76 is "YES", the operation is shifted to a step 78 in which judgement is made as to whether all the data read out for the test addresses have been correctly coincident with the test data on basis of the RAM areas stored in the step 74. If the result of judgement in the step 78 is "YES", it is indicated in a step 79 that the IC card is normal, that is, there is no fault in the IC card. If the result of judgement in the step 78 is "NO", on the contrary, a faulty portion, that is, a faulty one of the address and data lines is determined in a step 80 in accordance with the foregoing judging procedure on the basis of the data stored in the steps 74 and 75. The result of determination is indicated in a step 81.

Although the test addresses are defined such that in each address all the address lines are "0" or only a specific one of the address lines is "1", the invention is not limited to this, but the test addresses may be defined such that only a specific one of the address lines is "0", or, alternatively, any addresses may be set at the test addresses so long as all the addresses lines can be checked.

Further, the test data are not limited to those described above, but any data may be used as the test data so long as corresponding bits between the respective test data are not coincident with each other so as to enable all the data lines to be checked and so long as each test data include "1" as well as "0".

Figure 8:
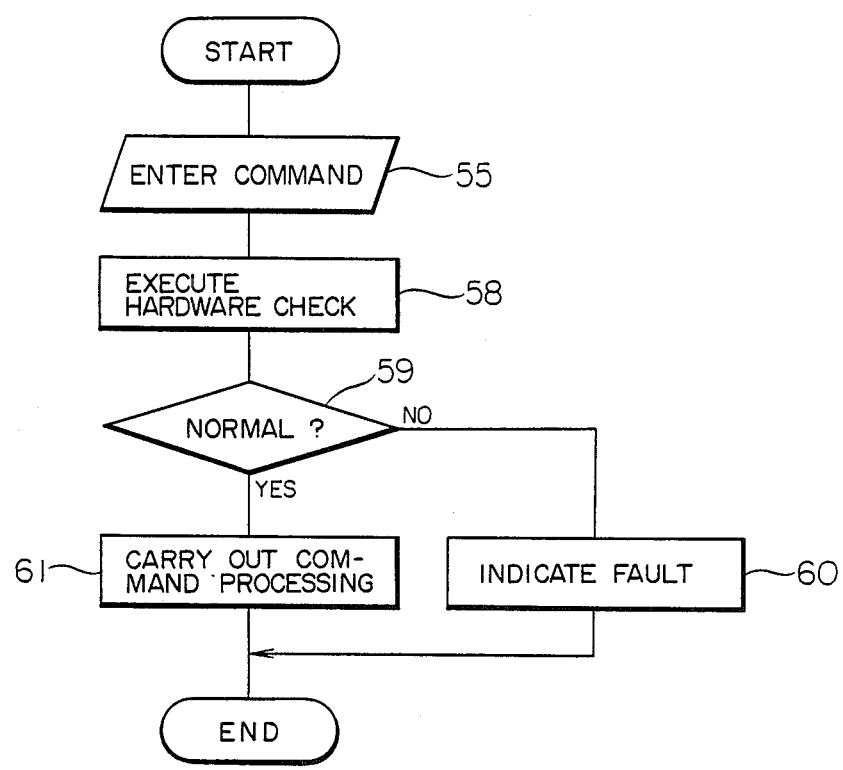
FIG. 8 is a flowchart for explaining another embodiment of the present invention.

Although the description has been made as to the case where it is possible to carry out a fault check at the time of data reading and writing operations when an IC card is used as well as a fault check at the time of maintenance, it is a matter of course that the IC card according to the present invention may has only a function to execute a fault check prior to the data reading and writing operations when the IC card is used as shown in FIG. 8.

What is claimed is:

1. An IC card having a fault check function and being provided with at least a CPU and a memory into which data can be written and from which data can be read out, said CPU and said memory being connected by at least a plurality of data lines and a plurality of address lines, said IC card comprising:
a plurality of test areas having a specific address test area at an address having bits that are all a same level and other address test areas having at least a significant bit corresponding to one of said address lines, each of said test areas having predetermined data that is different from data stored in the other test addresses, respectively;
reference means for holding the predetermined data corresponding to said data recorded in said test areas;
means for successively reading out said data recorded in said test areas;
means for detecting a coincidence of the respective data successively read out by said reading-out means with corresponding data held in said reference means; and
means for judging whether a fault exists or not in said IC card in response to an output of said coincidence detecting means.

2. An IC card having a fault check function according to claim 1, wherein the data stored in each of said test areas comprises bits, at least one of the bits constituting data stored in each of said test areas that is different from the corresponding bits constituting the data stored in other test areas.

3. An IC card having a fault check function according to claim 1, wherein the data stored in said specific test area comprises bits having the same level.

4. An IC card having a fault check function and being provided with at least a CPU and a memory into which data can be written and from which data can be read out, said CPU and said memory being connected by at least a plurality of data lines and a plurality of address lines; comprising:
test areas corresponding in number to the number of said address lines, said test areas being provided in said memory and having predetermined data for executing a fault check;
means for successively reading out said data in said test areas, said read out means executing the reading operation prior to the IC card executing other data reading and writing operations;
means for judging whether a fault exists or not in said IC card on the basis of the data successively read out by said reading-out means; and
means for carrying out a command for said data reading or writing operation only if said judging means judges that a fault does not exist in said IC card.

* * * * *

UNITED STATES PATENT AND TRADEMARK OFFICE
CERTIFICATE OF CORRECTION

PATENT NO. : Hiroshi WATANABE        Page 1 of 2
DATED : 4,760,575
INVENTOR(S) : July 26, 1988

It is certified that error appears in the above-identified patent and that said Letters Patent is hereby corrected as shown below:

| Column | Line | |
|---|---|---|
| Abstract | 10 | Please delete "n" and insert --in--. |
| 1 | 34 | Please insert --,-- after "is". |
| 1 | 35 | Please delete "perform" and insert --performs--. |
| 2 | 22 | Please delete "of", first occurrence. |
| 3 | 9 | Please delete "out the" and insert --out from the--. |
| 3 | 24 | Please delete "to" and insert --so--. |
| 3 | 34 | Please delete "disable the IC card to be" and insert --prevent the IC card from being-- |
| 4 | 35 | Please insert after ""O"" --are--. |
| 4 | 40 | Please delete "area" and insert --areas--. |

UNITED STATES PATENT AND TRADEMARK OFFICE
CERTIFICATE OF CORRECTION

PATENT NO. : 4,760,575

DATED : July 26, 1988

INVENTOR(S) : Hiroshi WATANABE

It is certified that error appears in the above-identified patent and that said Letters Patent is hereby corrected as shown below:

| Column | Line | |
|---|---|---|
| 5 | 12 | Please delete "indicators" and insert --indicates--. |
| 5 | 46 | Please insert after ""1"" --if--. |
| 6 | 35 | Please delete "it is" and insert --is it--. |
| 6 | 56 | Please delete "In" and insert --If--. |
| 7 | 40 | Please delete "addresses", second occurrence and insert --address--. |
| 7 | 53 | Please delete "has only a" and insert --only--. |

Signed and Sealed this

Twenty-eighth Day of February, 1989

Attest:

DONALD J. QUIGG

*Attesting Officer*  *Commissioner of Patents and Trademarks*